United States Patent [19]

Ikeda

[11] Patent Number: 4,884,058
[45] Date of Patent: Nov. 28, 1989

[54] COMBINATION INDICATOR APPARATUS FOR AUTOMOTIVE VEHICLE

[75] Inventor: Kimihiko Ikeda, Shizuoka, Japan

[73] Assignee: Yazaki Corporation, Japan

[21] Appl. No.: 242,347

[22] Filed: Sep. 9, 1988

[30] Foreign Application Priority Data

Sep. 11, 1987 [JP] Japan .................................. 62-226564

[51] Int. Cl.⁴ ........................... B60Q 1/00; G01R 1/00
[52] U.S. Cl. ..................................... 340/461; 340/438;
340/441; 340/525; 340/870.02; 340/973;
324/114; 116/62.4; 116/289
[58] Field of Search ................... 340/52 F, 52 R, 525,
340/870.02, 870.03, 973, 438–445, 448, 449,
459, 461; 324/114, 115, 140 R; 116/62.1–62.4,
284, 289, 290, 293, 305

[56] References Cited

U.S. PATENT DOCUMENTS

| | | | |
|---|---|---|---|
| 3,541,550 | 11/1970 | Hamre | 340/52 F |
| 4,177,497 | 12/1979 | McCook et al. | 116/62.4 |
| 4,230,984 | 10/1980 | Taylor | 324/167 |
| 4,464,933 | 8/1984 | Santis | 116/62.4 |
| 4,635,034 | 1/1987 | Tokuyama et al. | 340/52 F |
| 4,646,059 | 2/1987 | Iwamoto et al. | 340/52 F |

Primary Examiner—Donnie L. Crosland
Attorney, Agent, or Firm—Wigman & Cohen

[57] ABSTRACT

A combination indicator apparatus including an indicator assembly having plural analog indicators of the same type for independently indicating different information, plural driver circuits of the same type for independently driving the analog indicators; and a single controller containing a CPU and an instruction set, which controller may be disposed remote from the indicator assembly, for receiving various sensor information and transmitting various drive data to the driver circuits in time sharing data transmission mode, to independently indicate various information through the analog indicators.

4 Claims, 6 Drawing Sheets

COMBINATION INDICATOR APPARATUS FOR AUTOMOTIVE VEHICLE

BACKGROUND OF THE INVENTION

1. Field of the Invention

The present invention relates to a combination indicator apparatus for an automotive vehicle provided with a plurality of indicators, and more specifically to a combination indicator apparatus for an automotive vehicle which can indicate various information related to an automotive vehicle, such as vehicle speed, engine revolution rate, coolant temperature, fuel quantity, etc.

2. Description of the Prior Art

An example of prior art combination indicator apparatus is shown in FIG. 1, in which a speed meter 1, a tachometer (engine speed meter) 2, a coolant temperature meter 3, and a fuel meter 4 are incorporated in combination. The vehicle speed meter 1 is of the electromagnetic indication type, which comprises a rotary shaft 1a rotated by a vehicle wheel shaft linked to a transmission, a cylindrical magnet 1b fixed to the rotary shaft 1a, and an induction cap 1c magnetically coupled to the cylindrical magnet 1b. Therefore, when the cylindrical magnet 1b is rotated by the rotary shaft 1a at a rotary speed proportional to vehicle speed, since electromagnetic induction force according to the vehicle speed is generated between the magnet 1b and the induction cap 1c, the induction cap 1c is rotated and therefore a pointer 1d fixed to the induction cap 1c is rotated on a vehicle speed dial 1e to indicate vehicle speed.

The tachometer 2 comprises a period/voltage converter 2b for receiving a signal synchronized with an engine ignition signal via a signal wire 2a and outputting a signal whose voltage level is inversely proportional to the period of the ignition signal, and a movable coil movement 2c driven by the output signal from the period/voltage converter 2b. Therefore, when the movable coil movement 2c is energized, a pointer 2d fixed to the movable coil movement 2c is rotated on an engine speed dial 2e to indicate engine revolution rate.

The coolant temperature meter 3 comprises a cross-coil movement having two cross coils 3a and 3b and a magnet rotor 3c driven by the cross coils 3a and 3b when energized. The first coil 3a is energized by a current supplied from a supply voltage + and the second coil 3b is energized by a current applied from a coolant temperature sensor (not shown) via a signal wire 3d and proportional to coolant temperature. Therefore, the magnet rotor 3c is rotated by a resultant magnetic field generated by the two cross coils 3a and 3b, so that a pointer 3e fixed to the magnet rotor 3c is rotated on a temperature dial 3f to indicate coolant temperature.

The fuel meter 4 comprises a cross-coil movement having two cross coils 4a and 4b and a magnet rotor 4c driven by the cross coils 4a and 4b when energized. The first coil 4a is energized by a current supplied from a supply voltage + and the second coil 4b is energized by a current applied from a fuel sensor (not shown) via a signal wire 4d and proportional to the remaining fuel quantity. Therefore, the magnet rotor 4c is rotated by a resultant magnetic field generated by the two cross coils 4a and 4b, so that a pointer 4e fixed to the magnet rotor 4c is rotated on a fuel dial 4f to indicate the quantity of remaining fuel.

The above-mentioned four indicators are housed within a single casing 5 to construct a combination indicator apparatus for an automotive vehicle. Further, various sensor signals detected by sensors (not shown) are directly applied to the indicators to indicate various information.

In the above-mentioned prior art combination indicator apparatus, however, since the operating principles of the indicators are different from each other, different technology has been required for improvement in performance and productivity of the indicator. Therefore, the development cost required for the product and the manufacturing equipment is not concentrated, thus resulting in an increase of the apparatus cost.

In addition, since different indicators are actuated in different ways, different signal wires must be arranged therefor; it has been difficult to reduce the number of signal wires, and therefore a wastefull space is required for the vehicle, in particular, at the cowl portion at which a great number of wires are arranged. Further, since the movements of the indicators are different from each other in structure and shape, a large or complicated shape is required for the casing. In addition, since the troubleshooting methods are also different from each other, it takes much time to troubleshoot and repair these indicators, in different ways.

SUMMARY OF THE INVENTION

With these problems in mind, therefore, it is the primary object of the present invention to provide a combination indicator apparatus which apparatus performance, productivity, maintenance, etc., while reducing the cost thereof.

To achieve the above-mentioned object, the combination indicator apparatus for an automotive vehicle provided with a plurality of sensors for sensing various information related to the vehicle, according to the present invention, includes: (a) an indicator assembly having: (1) a plurality of information indicators of the same type, for independently indicating different information; and (2) a plurality of driver circuits of the same type for independently driving said information indicators; and (b) a single controller, which may be disposed remote from said indicator assembly, for receiving various information sensed by the sensors and transmitting the various drive data indicative of the received information to said driver circuits to display various information through said information indicators.

A feature of the instant application is to drive a plurality of the same type of indicators by a single controller in time-sharing serial transmission mode through a plurality of same type drive circuits, each of which drive circuits includes a shift register, in order to reduce the number of different elements in a combination indicator apparatus.

The single controller transmits various digital signals indicative of drive data to the driver circuits in serial time sharing transmission mode. Further, the controller is preferably housed within a junction box for connecting wire harness centrally.

In the combination indicator apparatus of the present invention, since the combination indicator assembly having a plurality of information indicators of the same type and a plurality of driver circuits of the same type is arranged remote from the single controller for receiving various information sensed by the sensors and transmitting various drive data to the driver circuits, it is possible to enhance performance, productivity, maintenance, etc. and therefore to reduce the cost thereof. Further, since the drive data are passed from the controller to the driver circuits in serial time sharing data transmission mode, it is possible to separately install the controller at any required position and to connect the controller to the indicator driver circuits via a single signal wire.

BRIEF DESCRIPTION OF THE DRAWINGS

The features and advantages of the combination indicator apparatus according to the present invention will be more clearly appreciated from the following description of the preferred embodiments of the invention taken in conjunction with the accompanying drawings in which.

DETAILED DESCRIPTION OF THE PREFERRED EMBODIMENTS

An embodiment of the present invention will be described hereinbelow with reference to the attached drawings.

Figure 2:
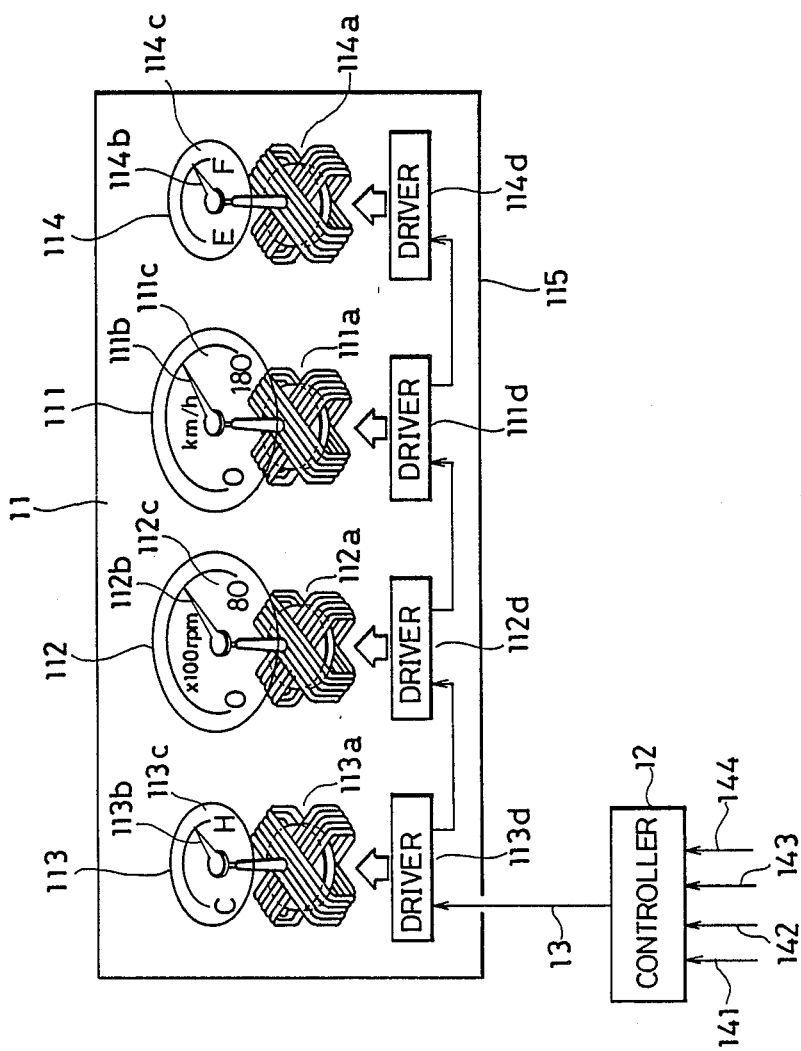
FIG. 2 is a similar diagrammatical view showing an embodiment of the combination indicator apparatus according to the present invention.

FIG. 2 is an example of the combination indicator apparatus of the present invention, in which four cross-coil meters are incorporated in combination. The apparatus roughly comprises an indicator assembly 11 and a controller 12 separated and disposed remote from the indicator assembly 11. The indicator assembly 11 comprises a speed indicator 111 for indicating vehicle speed, an engine speed indicator (tachometer) 112 for indicating engine revolution rate, a coolant temperature indicator 113 for indicating engine coolant temperature, a fuel indicator 114 for indicating the quantity of remaining fuel, and a casing 115 for housing these four analog indicators together.

The speed indicator 111 comprises a cross-coil movement 111a, a pointer 111b rotated by this movement 111a, a dial 111c for indicating a vehicle speed in cooperation with the pointer 111b, and a driver circuit 111d. In the same way, the engine speed indicator 112, the coolant temperature indicator 113 or the fuel indicator 114 each comprises a cross-coil movement 112a, 113a or 114a; a pointer 112b, 113b or 114b; a dial 112c, 113c or 114c; and a driver circuit 112d, 113d or 114d, respectively.

The controller 12 is disposed remote from the indicator assembly 11 and is connected to the four driver circuits 113d, 112d, 111d and 114d in series as shown in FIG. 2. This controller 12 receives a vehicle speed sensor signal via a first signal wire 141, an engine speed sensor signal via a second signal wire 142, a coolant temperature sensor signal via a third signal wire 143, and a fuel sensor signal via a fourth signal wire 144.

In response to these sensor signals, the controller 12 calculates or measures various data and supplies these calculated or measured data to the indicator assembly 11 via the signal wire 13.

The above four analog indicators 111, 112, 113 and 114 are of the same type and therefore only the indicator 111 will be described hereinbelow with reference to FIG. 3. The cross-coil movement 111a comprises first and second coils a-1 and a-2 lap-wound in the direction opposite to each other, third and fourth coils a-3 and a-4 also lap-wound in the direction opposite to each other and arranged at right angles with respect to the first and second coils, and a magnet rotor a-5 rotatably arranged at a point of intersection of the two sets of coils. A pointer 111b is fixed to a rotary shaft a-6 of the magnet rotor a-5. The first and second coils a-1 and a-2 are connected to each other at one end and further connected to a supply voltage +. The third and fourth coils a-3 and a-4 are connected to each other at one end and further connected to the same supply voltage +. The other end of the first coil a-1 is connected to a collector of a transistor $Q_1$; that of the second coil a-2 is connected to a collector of a transistor $Q_2$; that of the third coil a-3 is connected to a collector of a transistor $Q_3$; and that of the fourth coil a-4 is connected to a collector of a transistor $Q_4$. These four transistors $Q_1$ to $Q_4$ constitute a driver d-3 for driving the four coils a-1 to a-4, being incorporated in the driver circuit 111d.

When the first coil a-1 is energized, a magnetic field is generated in the direction A; when the second coil a-2 is energized, the magnetic field is generated in the direction B; when the third coil a-3 is energized, the magnetic field is generated in the direction C; and when the fourth coil a-4 is energized, the magnetic field is generated in the direction D.

Since the magnetic fields thus generated react upon the magnetic field of the magnet rotor a-5 distributed from the N pole to the S pole, it is possible to rotate the magnet rotor a-5 through 360 degrees by controlling the currents passed through these four coils a-1 to a-4, independently. That is, the pointer 11b fixed to the rotary shaft a-6 of the magnet rotor a-5 can be rotated on the dial 111c from any given angular position to any given angular position.

Figure 4:
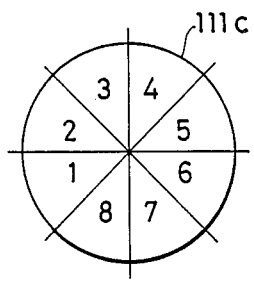
FIG. 4 is a view for aid in explaining the principle of a cross-coil meter type indicator.

In more detail with reference to FIG. 4, when a dial 111c is divided into 8 octant sectors 1 to 8 and a pointer 111b is required to direct in the boundary direction between two sectors 1 and 8, a maximum current is passed through the first coil a-1 without passing current through the other coils a-2, a-3, and a-4. Under these conditions, if current passed through the third coil a-3 is increased, the pointer 111b rotates within the sector 1 in the clockwise direction, while if current passed through the fourth coil a-4 is increased, the pointer 111b rotates within the sector 8 in the counterclockwise direction. Further, under the condition that a maximum current is passed through the first and third coils a-1 and a-3, if current passed through the first coil a-1 is decreased, the pointer 111b rotates within the sector 2 in the clockwise direction. In the same way, it is possible to rotate the pointer 111b in the clockwise direction by controllably passing current through the coils as listed below:

TABLE 1

| SECTOR NO. | COIL a-1 | a-2 | a-3 | a-4 |
|---|---|---|---|---|
| 1 | 1 | 0 | 0→1 | 0 |
| 2 | 1→0 | 0 | 1 | 0 |
| 3 | 0 | 0→1 | 1 | 0 |
| 4 | 0 | 1 | 1→0 | 0 |
| 5 | 0 | 1 | 0 | 0→1 |
| 6 | 0 | 1→0 | 0 | 1 |
| 7 | 0→1 | 0 | 0 | 1 |
| 8 | 1 | 0 | 0 | 1→0 |

Figure 1:
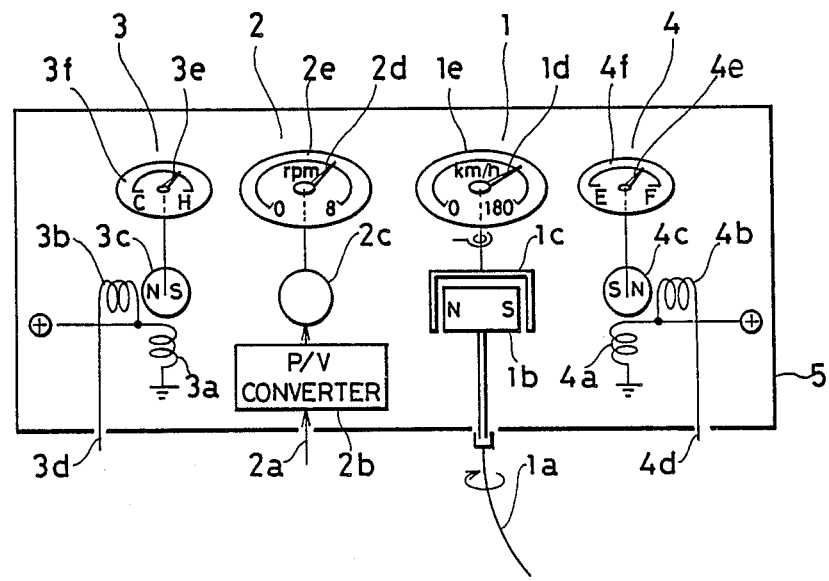
FIG. 1 is a diagrammatical view showing an example of prior art combination indicator apparatus.

The driver circuit 111d comprises a shift register d-1 for receiving drive data supplied from the controller 12 (FIG. 1) in the time sharing mode; a driver controller d-2 for generating driver control signals on the basis of the received drive data from the shift register d-1; and a coil driver d-3 for selectively activating four transistors $Q_1$ to $Q_4$ to pass current through the four coils a-1 to a-4 on the basis of the generated driver control signals from the driver controller d-2. The four transistors $Q_1$ to $Q_4$ are turned on or off on the basis of the four driver control signals applied to the bases of the transistors, respectively.

Figure 5:
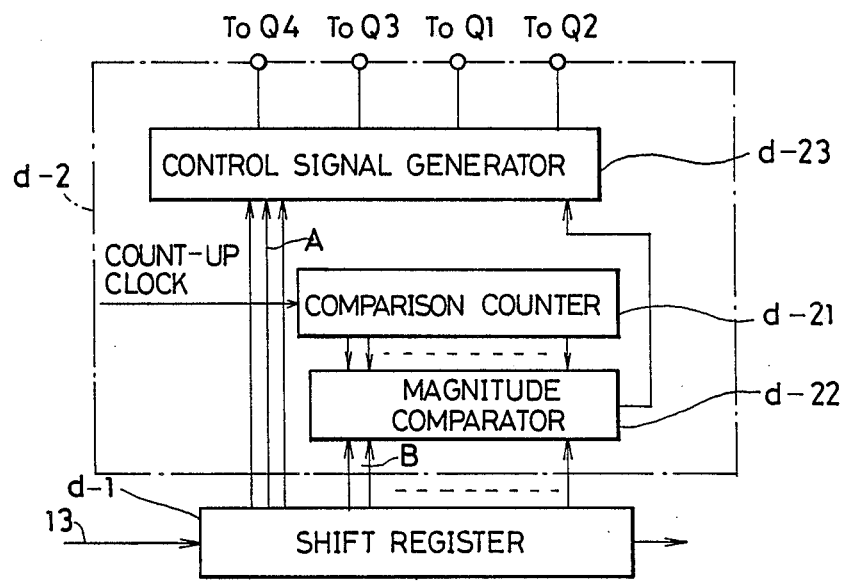
FIG. 5 is a block diagram showing the driver controller shown in FIG. 3.

With reference to FIG. 5, four drive data sets indicative of vehicle speed, engine speed, coolant temperature and fuel quantity are applied to the shift register d-1 and shifted at predetermined time intervals. However, the driver controller d-2 receives only the drive data related to vehicle speed (in the case of the driver circuit 111d) from the shift register d-1 in order to transmit driver control signals to the coil driver d-3.

The operation of the drive controller d-2 will be described hereinbelow with reference to FIG. 5. The driver controller d-2 comprises a comparison counter d-21, a magnitude comparator d-22, and a control signal generator d-23. The shift register d-1 receives drive data from the controller 12. This drive data includes a pointer orientation decision data set A (e.g., 3 bits) which decides which coil must be fully energized (e.g., coil a-1 when the pointer is required to direct along the boundary between the two octant sectors 1 and 8 in Table 1), and a coil drive duty decision data set B (e.g., 16 bits) which decides the duty factor of a drive pulse applied to a coil (e.g., coil a-3 when the pointer is rotated within the sector area 1 in the clockwise direction in Table 1). This drive data is passed to the driver controller d-2 in synchronism with count-up clock signals applied to the comparison counter d-21 at predetermined regular time intervals. The pointer orientation data set A is directly applied from the shift register d-1 to the control signal generator d-23. However, the coil drive duty data set B is formed by the magnitude comparator d-22.

This magnitude comparator d-22 outputs a high (H) level signal when the data from the shift register d-3 is larger than that from the comparison counter d-21, but a low (L) level signal when the data from the shift register d-3 is smaller than that from the comparison counter d-21, in order to output a pulse signal whose duty factor matches that of the coil drive duty decision data set B supplied from the shift register d-1.

In operation, when a duty decision data set is sent to the shift register d-1 on the basis of drive data supplied from the controller 12 (FIG. 2) and further the comparison counter d-21 is reset, the magnitude comparator d-22 begins to compare both data supplied both from the shift register d-1 and from the comparison counter d-21. At the beginning, since the data from the shift register d-1 is larger than that from the comparison counter d-21, the magnitude comparator d-22 outputs an H level signal. Thereafter, since a count-up clock signal is inputted to the comparison counter d-21, the counter value is incremented by one. However, since the data from the shift register d-1 is still greater than that from the comparison counter d-21, the magnitude comparator d-22 keeps outputting an H level signal.

However, since the comparison counter d-21 keeps counting the count-up clock pulses, when the counted up value in the comparison counter d-21 exceeds the duty decision data B from the shift register d-1, the magnitude comparator d-22 outputs an L level signal. Thereafter, since the comparison counter d-21 is kept counted up, the magnitude comparator d-22 keeps outputting an L level. However, when the comparison counter d-21 rolls over and therefore is reset again, since the value of the comparison counter d-21 is smaller than that of the duty-decision data set B from the shift register d-1, the magnitude comparator d-22 again outputs an H level signal. By repeating the above operation it is possible to continuously obtain a pulse signal whose duty factor is determined on the basis of coil drive duty decision data set B supplied from the controller 12 (FIG. 2) to the shift register d-1 in synchronism with the count-up clock.

In response to these two coil drive signals of the pointer orientation decision data set A directly supplied from the shift register d-1 and the coil drive duty decision data set B supplied from the magnitude comparator d-22, the control signal generator d-23 generates four coil drive signals.

Figure 6:
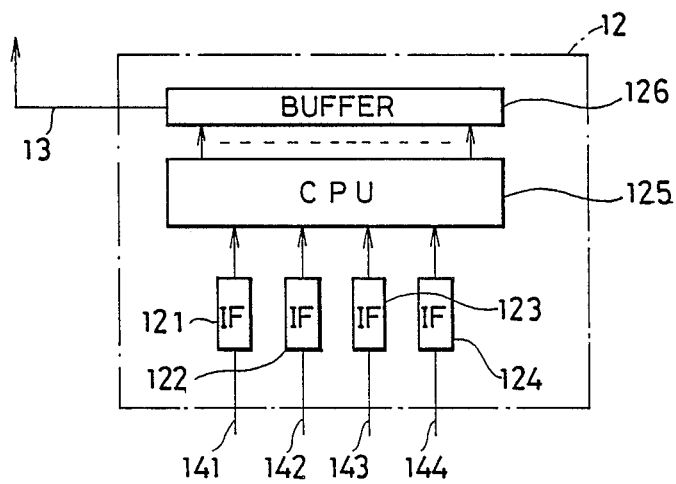
FIG. 6 is a block diagram showing the controller shown in FIG. 2.

FIG. 6 shows a controller 12 disposed remote from the combination indicator assembly 11 to control the operation of the combination indicators. The controller 12 comprises a first interface 121 for receiving vehicle speed sensor signals via a first signal wire 141; a second interface 122 for receiving engine speed sensor signals via a second signal wire 142; a third interface 123 for receiving coolant temperature sensor signal via a third signal wire 143; a fourth interface 124 for receiving fuel sensor signals via a fourth signal wire 144; a microprocessor (i.e., CPU provided with ROM and RAM) for measuring vehicle speed, engine speed, coolant temperature and fuel quantity on the basis of corresponding sensor signals to form four cross-coil drive data sets A and B, separately; and a buffer circuit 126 for outputting four cross-coil drive data sets formed by the CPU 125 to the shift register d-1 via a signal wire 13 in time sharing transmission method.

Figure 7A:
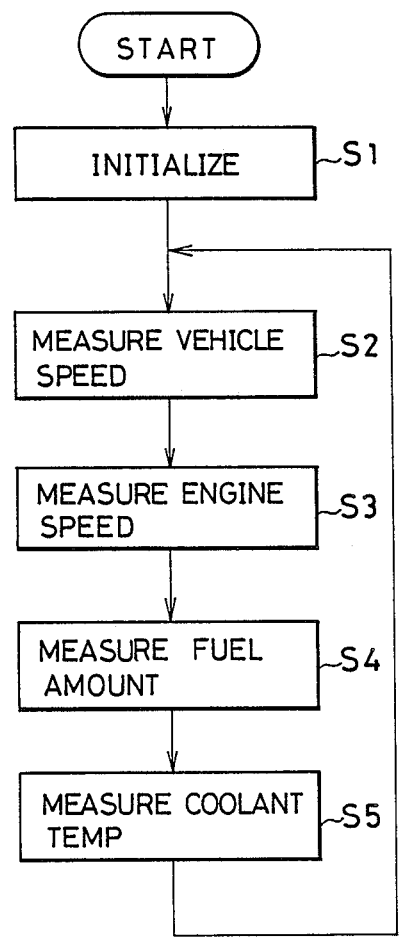
FIGS. 7(A) and 7(B) are flowcharts for aid in explaining the control operation of the CPU-based controller shown in FIG. 6.

The operation of the CPU 125 will be described hereinbelow with reference to flowcharts shown in FIGS. 7(A) and 7(B). The programs shown by the flowcharts are stored in the ROM of the CPU 125.

The controller starts the program execution when an ignition key is turned on and therefore a power supply voltage is supplied to the apparatus. The internal memory units, input/output ports, etc., are first initialized in step S1. Thereafter, the controller first measures vehicle speed by measuring periods of pulses indicative of vehicle speed or by counting the number of the pulses generated within a predetermined time duration (in step S2). The controller measures engine speed by measuring periods of engine ignition timing pulses (in step S3). The controller measures the quantity of fuel on the basis of a digital signal converted from an analog signal indicative of liquid level within a fuel tank through the interface 124 (in step S4). The controller measures coolant temperature on the basis of a digital signal converted from an analog signal indicative of coolant temperature through the interface 124.

These measured values are converted into four pointer orientation decision data sets A indicative of pointer angular positions and four coil drive duty decision data sets B indicative of a duty factor of four transistor ($Q_1$ to $Q_4$) on/off drive pulses in accordance with conversion look-up tables stored in the ROM. These data sets are all stored in the RAM of the CPU 125.

As described above, the controller 12 receives various sensor signals (vehicle speed, engine speed, coolant temperature and fuel quantity) via the signal wires 141 to 144 in sequence at predetermined time intervals; it forms four drive data sets on the basis of the received signals; it stores these data sets in a predetermined area of the RAM to update the data; and sends out these data to the combination indicator assembly 11 at predetermined time intervals in predetermined sequence via the signal wire 13; that is, in serial time sharing data transmission mode.

Since each of these drive data sets indicative of sensor values includes pointer orientation decision data set A (octant sector data) of a predetermined number of bits (e.g., 3 bits) directly applied from the shift register d-1 to the control signal generator d-23 and coil drive duty decision data set B (within an octant sector) applied from the magnitude comparator d-22 to the control signal generator d-23, it is possible to determine the on/off conditions of the four coils, that is, to determine the pointer position on the dial.

Figure 7B:
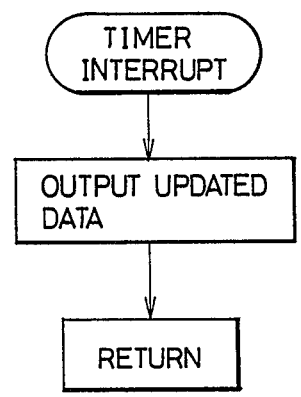

On the other hand, a timer interrupt subroutine as shown in FIG. 7(B) is provided. Therefore, the controller accesses this subroutine, whenever a predetermined time has elapsed to output four updated drive data sets in the order quantity of fuel, vehicle speed, engine speed and coolant temperature to the buffer circuit 126, and then to the shift registers d-1 of the four driver circuits 114*d*, 111*d*, 112*d* and 113*d* via the single signal wire 13 in time sharing mode.

The drive data sets are shifted one by one through each shift register (e.g. d-1), so that the drive data is supplied to each of the four driver circuits 111*d* to 114*d* in sequence to drive each indicator.

Figure 8:
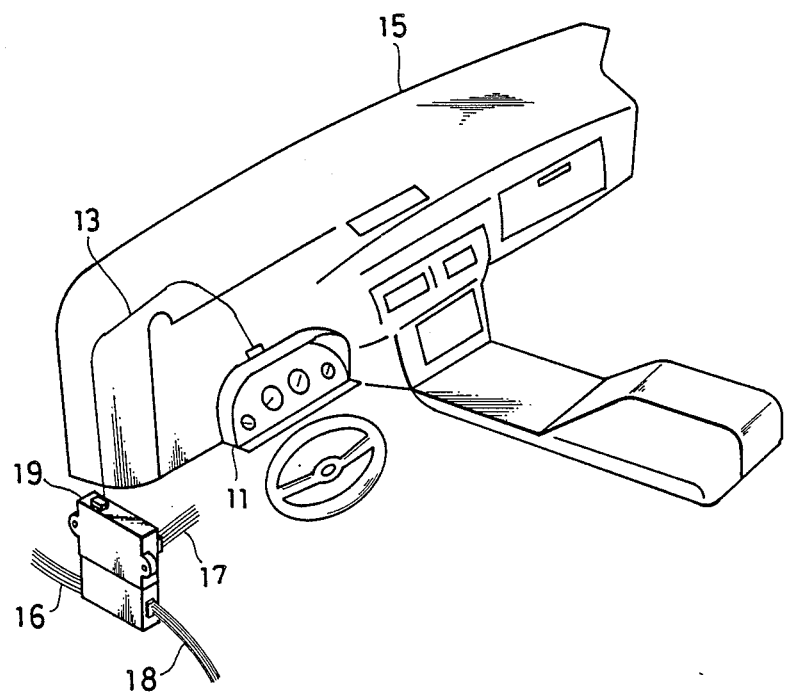
FIG. 8 is a perspective view showing the combination indicator apparatus of the present invention mounted on an automotive vehicle.

FIG. 8 shows an example of the combination indicator apparatus according to the present invention mounted on an automotive vehicle, in which the combination indicator assembly 11 is arranged on a part of a dashboard 15 in front of a driver seat and the controller 12 (shown in FIGS. 1 and 5) is housed within a junction box 19 and connected to the indicator assembly 11 via the single signal wire 13. Further, in FIG. 8, the reference numerals 16, 17 and 18 denote wire harnesses arranged in the cowl (the upper front portion of a vehicle including the firewall and dashboard) for facilitating the wiring of various electrical devices or equipment.

When the controller 12 is housed within the junction box 19, it is possible to arrange the sensor wires 141 to 144 shown in FIG. 6 as part of the wire harnesses 16, 17 and 18 and therefore it is possible to minimize the number and the space of the wire harness.

As described above, since all the movements used for the combination indicator apparatus are of the same structure, it is possible to adopt the same indicator driving method, facilitating the improvement in indicator performance, productivity, etc., while reducing the cost of the apparatus.

Further, in the embodiment described above, since the driver circuits are connected in cascade fashion and therefore the drive data are transmitted in time sharing mode, when other indicators such as hydraulic pressure meter, voltmeter, ammeter, etc. are additionally provided according to the car model, it is possible to easily incorporate these additional meters by simply modifying the control program executed by the CPU 125 of the controller 12.

Further, although only four analog indicators are provided for the combination indicator assembly in the above embodiment in practice it is necessary to provide some display devices for warnings. In this case, a plurality of sensor or switch signals are once connected to the controller 12 via a number of signal wires, and then outputted from the controller 12 to the combination indicator assembly 11 in time sharing data transmission mode. Therefore, the number of signal wires 13 connected between the controller 12 and the combination indicator assembly 11 can be reduced to one or two at the most.

Further, in order to drive the above alarm display devices, only a single shift register is required for plural display devices, and plural display drive data sets are shifted in series one by one through the shift register.

Further, in the above embodiment, although plural shift registers are connected in cascade, it is also possible to connect plural driver circuits 111d to 114d in parallel. In this case, each driver circuit is designated by an address code and the same destination address code is attached at the beginning of the drive data set.

Figure 3:
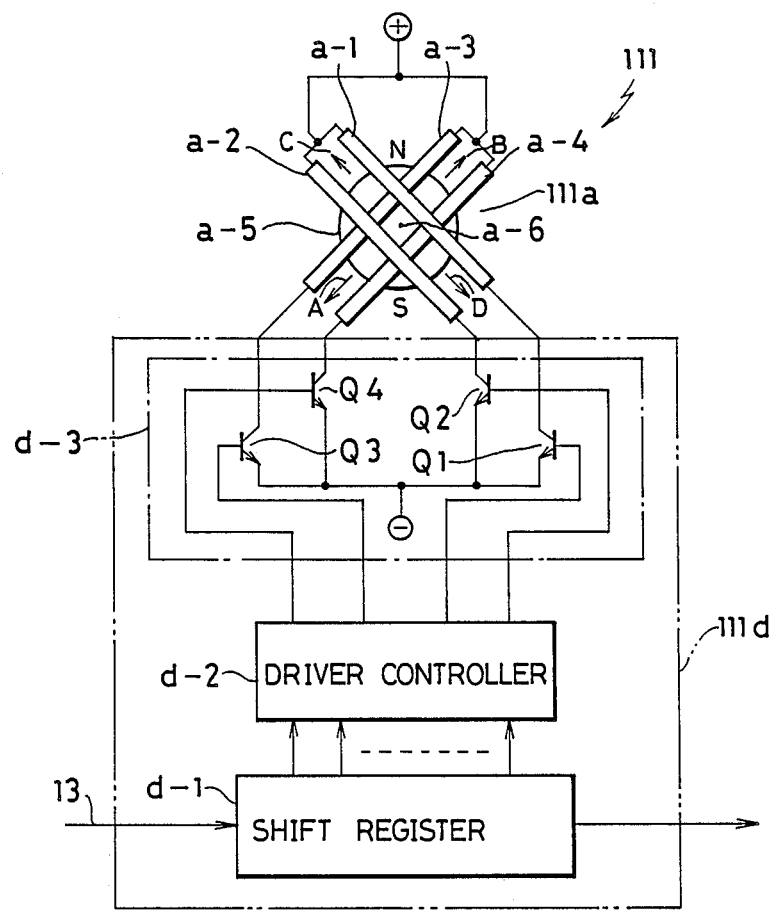
FIG. 3 is a schematic block diagram showing one of the indicators incorporated in the apparatus shown in FIG. 2.

Further, in FIG. 3, the cross-coil movement can rotate a pointer through 360 degrees. In practice, however, since the pointer indication range is not so large, some of eight octant sectors are omitted by restricting the pointer orientation decision data.

In the combination indicator apparatus of the present invention as described above, since the combination indicator assembly including plural cross-coil movements and plural driver circuits, and the controller for collecting various indicator information and outputting drive signals to the driver circuits are arranged remote from each other on an automotive vehicle, it is possible to incorporate a plurality of the same indicators and the same driving circuits, thus enhancing performance, productivity, maintenance, etc., and therefore reducing the cost thereof.

In addition, since the drive signals are passed from the controller to the combination indicator assembly in time sharing data transmission mode, it is possible to separated install the controller at any required position and to connect the controller to the driver circuits via a single signal wire, thus making the best use of the wire harness arranged in an automotive vehicle.

What is claimed is:
1. A combination indicator apparatus for an automotive vehicle provided with a plurality of sensors for sensing various information related to the vehicle, comprising:
  (a) an indicator assembly including:
  (1) a plurality of analog information indicators of the same type, for indicating different information, independently; and
  (2) a plurality of driver circuits of the same type, each provided with a digital shift register and each associated with one of said analog information indicators, for driving said analog information indicator independently through said shift register; and

(b) a single controller, disposed remote from said indicator assembly, for receiving various information sensed by the sensors and transmitting various digital drive data indicative of the received information to said driver circuits to indicate various information on said analog information indicators via said driver circuits, independently in serial time sharing mode.

2. The combination indicator apparatus for an automotive vehicle of claim 1, wherein said controller is housed within a junction box for connecting wire harness centrally.

3. The combination indicator apparatus for an automotive vehicle of claim 1, wherein said information indicating means is a cross-coil meter movement.

4. A method of displaying instrumentation information on a plurality of similar analog display indicators included in an automobile combination indicating apparatus, comprising:

(a) sensing a plurality of discrete automobile operating parameters and providing said parameters as digital signals to a controller;

(b) converting said digital signals in the controller to a time-shared signal along a serial bus;

(c) communicating said time-shared digital signals to a driver controller containing a shift register;

(d) converting the time-shared digital signals to a plurality of instrument signals, each of which signals represents a separate one of said automobile operating parameters; and (e) driving a plurality of analog display indicators with said instrument signals, each of said signals being displayed on a separate analog display indicator.

* * * * *